(12) United States Patent
Terashima et al.

(10) Patent No.: US 7,050,152 B2
(45) Date of Patent: May 23, 2006

(54) EXPOSURE APPARATUS

(75) Inventors: Shigeru Terashima, Tochigi (JP); Noriyasu Hasegawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 49 days.

(21) Appl. No.: 10/912,926

(22) Filed: Aug. 5, 2004

(65) Prior Publication Data

US 2005/0030504 A1 Feb. 10, 2005

(30) Foreign Application Priority Data

Aug. 7, 2003 (JP) .............................. 2003-288438

(51) Int. Cl.
*G03B 27/42* (2006.01)
*G03B 27/52* (2006.01)
(52) U.S. Cl. .......................................... 355/53; 355/30
(58) Field of Classification Search ................... 355/30, 355/53, 67, 72, 75; 250/548; 430/311; 356/399–401
See application file for complete search history.

(56) References Cited

U.S. PATENT DOCUMENTS

| | | | |
|---|---|---|---|
| 6,198,792 B1 | 3/2001 | Kanouff et al. | |
| 6,333,775 B1* | 12/2001 | Haney et al. | 355/30 |
| 6,707,529 B1* | 3/2004 | Aoki et al. | 355/30 |
| 6,791,661 B1* | 9/2004 | Sato | 355/30 |
| 6,842,221 B1* | 1/2005 | Shiraishi | 355/30 |

FOREIGN PATENT DOCUMENTS

| | | |
|---|---|---|
| JP | 7-263322 | 10/1995 |
| JP | 2002-529927 | 9/2002 |
| WO | 00/28384 | 5/2000 |

* cited by examiner

*Primary Examiner*—Henry Hung Nguyen
(74) *Attorney, Agent, or Firm*—Morgan & Finnegan, LLP (57) ABSTRACT

An exposure apparatus for exposing an object put on a first stage by irradiating light from a light source onto the object through an exposure optical system includes a partition for isolating a first space where the first stage is arranged and isolating a second space where the exposure optical system is arranged, a first management part that manages a degree of vacuum of the first space, and a second management part that manages a degree of vacuum of the second space.

18 Claims, 6 Drawing Sheets

EXPOSURE APPARATUS

This application claims foreign priority benefits based on Japanese Patent Applications No. 2003-288438, filed on Aug. 7, 2003, which is hereby incorporated by reference herein in its entirety as if fully set forth herein.

BACKGROUND OF THE INVENTION

The present invention relates to an exposure apparatus, and more particularly to an exposure apparatus that exposes an object, such as a single crystal substrate and a glass plate for a liquid crystal display ("LCD"). The present invention is suitable, for example, for an exposure apparatus that uses extreme ultraviolet ("EUV") light for an exposure light source.

Conventionally, during manufacturing, photolithography technology, a reduction projection exposure apparatus using a projection optical system to project a circuit pattern formed on a reticle (mask) onto a wafer, etc., has been employed for transferring the circuit pattern of fine semiconductor devices such as semiconductor memory and logic circuit.

The minimum critical dimension transferred by the projection exposure apparatus or resolution is proportional to the wavelength of light used for exposure and inversely proportional to the numerical aperture ("NA") of the projection optical system. The shorter the wavelength is, the better the resolution. Thus, along with recent demands for finer semiconductor devices, shorter ultraviolet light wavelengths have been proposed—from an ultra-high pressure mercury lamp (I-line with a wavelength of approximately 365 nm) to KrF excimer laser (with a wavelength of approximately 248 nm) and ArF excimer laser (with a wavelength of approximately 193 nm).

However, lithography using ultraviolet light has limitations when it comes to satisfying the rapidly promoted fine processing of a semiconductor device. Therefore, a reduction projection optical system using extreme ultraviolet ("EUV") light with a wavelength of 10 to 15 nm shorter than that of the ultraviolet (referred to as an "EUV exposure apparatus" hereinafter) has been developed to efficiently transfer very fine circuit patterns of 100 nm or less.

Since materials greatly absorb the light of a wave range of the EUV light, a refractive optical system (that utilizes lenses or refractions of light) for use with visual light and UV light is not viable because of the low transmittance of the EUV light to an optical element, such as a lens. Therefore, a catoptric optical system is used which utilizes reflections of light. A reticle also uses a reflection reticle that uses an absorber on a mirror to form a pattern to be transferred.

The EUV light is strongly absorbed by a gas. For instance, when the EUV light propagates a space filled with an air of 10 Pa by 1 m, the EUV light of about 50% is absorbed. It is necessary to maintain the space to which the EUV light propagates to a pressure of at least $10^{-1}$ Pa or less, desirably $10^{-3}$ Pa or less, to evade the absorption of the EUV light by the gas.

Moreover, carbon compounds found in air, such as hydrocarbons, remains in a space that an optical member (for example, a mirror and reticle) irradiating the EUV light is arranged, the carbon gradually adheres to the surface of the optical member. As a result, reflectivity decreases because the carbon absorbs the EUV light. It is necessary to maintain the space where the optical member irradiating the EUV light is arranged to a pressure of at least $10^{-4}$ Pa or less, desirably $10^{-6}$ Pa or less, to prevent the carbon adhering to the surface of the optical member.

An exposure apparatus that considers these things is proposed in Japanese Laid-Open Patent Application No. 07-263322 and Japanese translation of PCT international application No. 2002-529927.

However, the exposure apparatus repeats an operation that carrying the wafer coated with a resist from the outside into the exposure apparatus, then transfers the circuit pattern of the reticle onto the wafer, and carrying out of the exposure apparatus. A wafer stage has a transport mechanism composed of a movement mechanism for a scanning exposure and carrying mechanism that carries the wafer. Therefore, as for the wafer stage, creating a high vacuum is extremely difficult because of the surface area increases and out gas generated from these parts.

Moreover, the resist spread on the wafer is an carbon compound which has been heated before the exposure. Then, when the wafer is carried in the vacuum, the carbon compound that is the resolved material, etc. that compose the resist evaporate, and it diffuses in the apparatus maintained to the vacuum. The wafer is carried from an atmosphere to the inside of the exposure apparatus, so according to carrying the wafer, losing an atmospheric constituent, which includes moisture that adheres to the wafer, in a short time is difficult. The atmospheric constituent desorbs gradually in the vacuum. It is very difficult to maintain the inside of the exposure apparatus to the high vacuum because of the out gas from the wafer and resist.

The vacuum can be improved with a mass vacuum pump etc., but it is necessary to prevent the carbon compound and the moisture to diffuse in the exposure apparatus, especially in the space that the mirror and the reticle are arranged.

BRIEF SUMMARY OF THE INVENTION

Accordingly, it is an exemplary object of the present invention to provide an exposure apparatus that can stably perform exposure by preventing diffusion of out gas in a space that a mirror and a reticle are arranged, and maintaining high vacuum.

An exposure apparatus of one aspect according to the present invention for exposing an object put on a first stage by irradiating light from a light source onto the object through an exposure optical system, the exposure apparatus includes a partition for isolating a first space that the first stage is arranged and isolating a second space where the exposure optical system is arranged, a first management part that manages a degree of vacuum of the first space, and a second management part that manages a degree of vacuum of the second space.

An exposure apparatus of another aspect according to the present invention for exposing a pattern of a reticle put on a reticle stage onto an object via an exposure optical system, the exposure apparatus includes a partition for isolating a first space that the reticle stage is arranged and isolating a second space that the exposure optical system is arranged, a first management part that manages a degree of vacuum of the first space, and a second management part that manages a degree of vacuum of the second space.

An exposure method of another aspect according to the present invention for illuminating a reticle with light from a light source, and exposing a pattern of the reticle, the exposure method includes the steps of isolating a light path of the light from the light source to the object through to plural spaces where light can substantially pass through, and controlling a pressure of the plural spaces isolated so that a pressure of the space of the light source side is the highest and a pressure of the space that the object is arranged the lowest.

A device fabrication method of another aspect according to the present invention includes the steps of exposing an object using an exposure apparatus, and performing a development process for the object exposed, wherein the exposure apparatus for exposing the object put on a first stage by irradiating light from a light source onto the object through an exposure optical system, the exposure apparatus includes a partition for isolating a first space that the first stage is arranged and isolating a second space that the exposure optical system is arranged, a first management part that manages a degree of vacuum of the first space, and a second management part that manages a degree of vacuum of the second space.

Other objects and further features of the present invention will become readily apparent from the following description of the preferred embodiments with reference to the accompanying drawings.

DETAILED DESCRIPTION OF THE PREFERRED EMBODIMENTS

With reference to the accompanying drawings, a description will be given of an exposure apparatus of one embodiment according to the present invention. In each figure, the same reference numeral denotes the same element. Therefore, duplicate descriptions will be omitted. Here, FIG. 1 is a schematic sectional view of an exposure apparatus 100 as one aspect according to the present invention.

The inventive exposure apparatus 100 is a projection exposure apparatus that uses, as illumination light for exposure, EUV light (e.g., with a wavelength of 13.4 nm) to perform a step-and-scan or step-and-repeat exposure that transfers a circuit pattern on a reticle 120 onto an object 140 to be exposed. Such an exposure apparatus is suitably applicable to a lithography process below submicron or quarter-micron, and a description will be given below of this embodiment exemplarily using a step-and-scan exposure apparatus (which is also called "a scanner"). The step-and-scan manner, as used herein, is an exposure method that exposes a reticle pattern onto a wafer by continuously scanning the wafer relative to the reticle, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

Figure 1:
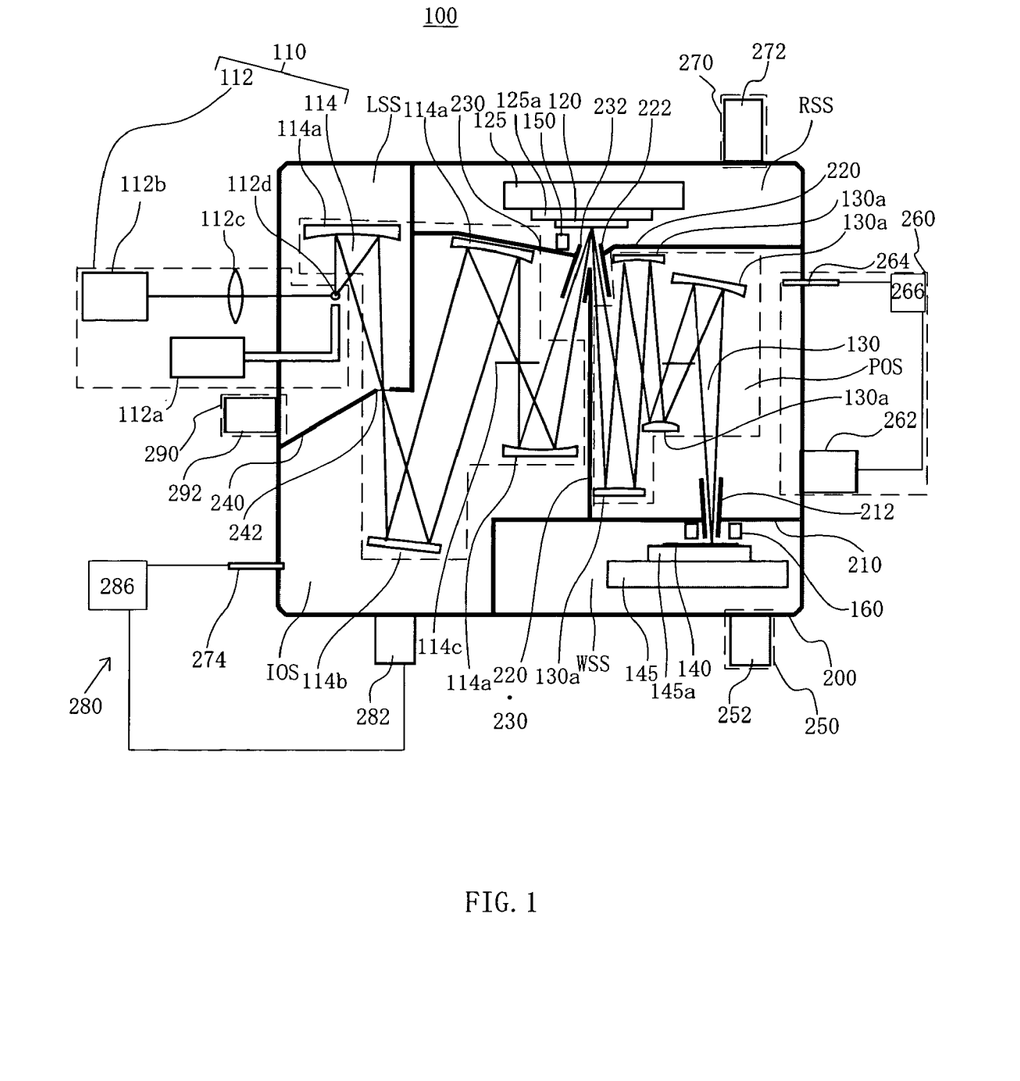
FIG. 1 is a schematic sectional view of an exposure apparatus as one aspect according to the present invention.

The exposure apparatus 100 includes, as shown in FIG. 1, an illumination apparatus 110 for illuminating a reticle 120 which forms a circuit pattern, a reticle stage 125 that mounts the reticle 120, a projection optical system 130 that projects diffracted light created from the illuminated reticle pattern onto an object 140, a wafer stage 145 that mounts the object 140, an alignment detection mechanism 150, and a focus position detecting mechanism 160.

The EUV light has low transmittance to the air and causes contaminations as a result of response to components of residual gas (or polymer organic gas) and out gas etc. Thereby, the exposure apparatus 100 is stored by a chamber 200 (which will be described later), and at least the optical path through which the EUV light travels (or the entire optical system) should preferably be maintained in a vacuum atmosphere.

The illumination apparatus 110 uses arc EUV light corresponding to an arc field in the projection optical system 130, to illuminate the reticle 120, and includes an EUV light source 112 and an illumination optical system 114.

The EUV light source 112 uses, for example, a laser plasma light source. The laser plasma light source 112 irradiates a highly intensified pulse laser beam to a target material supplied from a target supply apparatus 112a and put in vacuum, via a condenser lens 112c from an excitation pulse laser 112b, thus generating high-temperature plasma 112d for use as EUV light with a wavelength of about 13.4 nm emitted from this. The target material supplied by the target supply apparatus 112a may use a metallic thin film, inert gas, and droplets, etc. The pulse laser 112b preferably has high repetitive frequency, e.g., usually several kHz, for increased average intensity of the emitted EUV light. Alternatively, the EUV light source 112 may use a discharge plasma light source. Of course, the EUV light source 112 is not limited to them, but may use any technology known in the art.

The illumination optical system 114 includes a condenser mirror 114a and an optical integrator 114b. The condenser mirror 114a condenses EUV light that is radiated approximately isotropically from the laser plasma light source. The optical integrator 114b uniformly illuminates the reticle 120 with a predetermined numerical aperture. The illumination optical system 114 further includes an aperture 114c at a position optically conjugate with the reticle 120, which limits an illumination area of the reticle 120 to an arc shape.

The reticle 120 is a cataoptric reticle, and forms, on a mirror, a circuit pattern (or image) to be transferred. The reticle 120 is supported and driven by the reticle stage 125. The diffracted light emitted from the reticle 120 is projected onto the object 140 after reflected by the projection optical system 130. The reticle 120 and object 140 are arranged optically conjugate with each other. Since the exposure apparatus 100 of this embodiment is a scanner, the reticle 120 and the object 140 are scanned at the speed ratio of the reduction ratio of the projection optical system 130, thus transferring the pattern from the reticle 120 to the object 140. If it is a step-and-repeat exposure apparatus (referred to as a "stepper"), the reticle 120 and the object 140 remains still when exposing the reticle pattern.

The reticle stage 125 supports the reticle 120 via a reticle chuck 125a, and is connected to a moving mechanism (not shown). The reticle stage 125 can use any structure known in the art. The reticle chuck 125a absorbs the reticle 120 by an electrostatic absorption power. The moving mechanism (not shown) includes a linear motor, etc., and moves the reticle 120 by driving the reticle stage 125 at least in a direction X. The exposure apparatus 100 scans the reticle 120 and the object 140 synchronously. Here, X is a scan direction on the reticle 120 or the object 140, Y is a direction perpendicular to it, and Z is a perpendicular direction to the surface of reticle 120 or the object 140.

The projection optical system 130 uses plural reflection mirrors 130a to project a reduced size of a pattern formed on the reticle 120 onto the object 140 at an image surface. The reflection mirror that composes the EUV exposure apparatus is a grazing incidence total reflection mirror and a multilayer mirror. In the wave range of the EUV light, a real part of the refractive index is slightly smaller than 1. Therefore, the angle of incidence is large and the EUV light closely incidents on a reflection surface becoming total reflection. The grazing incidence total reflection mirror uses this phenomenom, and, usually, when the range of an angle from the reflection surface is greater than 0 and less than 20 degrees, high reflectivity of 80% or more can be obtained. However, a freedom in an optical design of the grazing incidence total reflection mirror is small because of the limitation of the incident angle, and it is difficult to use the grazing incidence total reflection mirror for the projection optical system 130. The multilayer mirror, that alternately forms or layers two kind of materials having different optical constants (refractive index), can use the incident angle near the vertical incidence. The multilayer mirror can obtain the reflectivity of about 70% by appropriately setting the materials of the layers and number of lamination layer. For example, Mo/Si multilayer (coating cycle 7 nm) mirror, that alternately forms 20 layers with molybdenum (Mo) layer about 2 nm thick and a silicon (Si) layer about 5 nm thick, on a precisely polished glass plate that has the reflectivity of 67.5% for wave range of vicinity of wavelength 13.4 nm. The multilayer mirror reflects EUV light with a specific wavelength when receiving EUV light. Efficiently reflected EUV light is one within a narrow bandwidth around $\lambda$ that satisfies Equation 1 below where $\lambda$ is a wavelength of the reflected EUV light, $\theta$ is an incident angle and d is a coating cycle and the bandwidth is about 0.6 to 1 nm:

$$2 \cdot d \cdot \sin \theta = \lambda \quad (1)$$

The projection optical system 130, in the instant embodiment, uses the multilayer mirror as plural reflection mirrors 130a. Even if the multilayer mirror is used for the reflection mirror 130a, the loss of light is larger than with a mirror of visual light, thereby it is necessary to suppress the number of the reflection mirrors 130a to the minimum. As for the number of the reflection mirrors 130a, about four to six are desirable. For wide exposure area with the small number of mirrors, the reticle 120 and object 140 are simultaneously scanned to transfer a wide area that is an arc-shaped area or ring field apart from the optical axis by predetermined distance. The projection optical system 130 has a numerical aperture ("NA") of about 0.1 to 0.2.

The object 140 is an exemplary object to be exposed, such as a wafer and a LCD, and photoresist is applied to the object 140.

The object 140 is supported by the wafer stage 145 through a wafer chuck 145a. The wafer stage 145 uses, for example, a linear motor to move the object 140 in X-Y-Z directions. The reticle 120 and object 140 are, for example, scanned synchronously, and the positions of the reticle stage 125 and wafer stage 145 are monitored, for example, by a laser interferometer and the like, so that both are driven at a constant speed ratio. The wafer stage 145a is placed on rough and fine movement stages and is a hyperbolic electrostatic chuck having two electrodes.

The alignment detection mechanism 150 measures positional relationships between the reticle 120 and the optical axis of the projection optical system 130, and between the object 140 and the optical axis of the projection optical system 130, and sets positions and angles of the reticle stage 125 and the wafer stage 145 so that a projected image of the reticle 120 accords with a predetermined position on the object 140.

The focus position detection mechanism 160 measures a focus position of the object 140 in a direction Z, controls a position and an angle of the wafer stage 145, and always maintains a surface of the object 140 at an image position by the projection optical system 130 during exposure.

Hereafter, it explains most features of the chamber 200 in the exposure apparatus 100. The chamber 200 has plural consecutive compartments. The compartment stores the component of the exposure apparatus 100 (for example, the illumination apparatus 110, the reticle stage 125, projection optical system 130 and wafer stage 145 etc.) by separating the chamber into compartments.

In FIG. 1, 210 is a partition for isolating a space that the wafer stage 145 is arranged and a space that the projection optical system 130 is arranged, 212 is an open part that the EUV light passed through from the projection optical system 130, 220 is a partition for isolating the space that the projection optical system 130 is arranged and a space that the reticle stage 125 is arranged, 222 is an open part that the EUV light reflected from the reticle 120 passes, 230 is a partition for isolating the space that the reticle stage 125 is arranged and a space that the illumination optical system 114 is arranged, 232 is an open part through which the EUV light illuminating the reticle 120 passes, 240 is a partition for isolating a space that the EUV light source 112 is arranged and the space that the illumination optical system 114 is arranged, 242 is an open part through which the EUV light from the EUV light source 112 side passes through to the illumination optical system 114 side, WSS is a wafer stage space, POS is a projection optical system space, RSS is a reticle stage space, IOS is an illumination optical system space, LSS is a light source space, 250, 260, 270, 280 and 290 are a management part, 252, 262, 272, 282 and 292 are an exhaust part, 264 and 284 are a supply part, and 266 and 286 are a supply controller.

Figure 2:
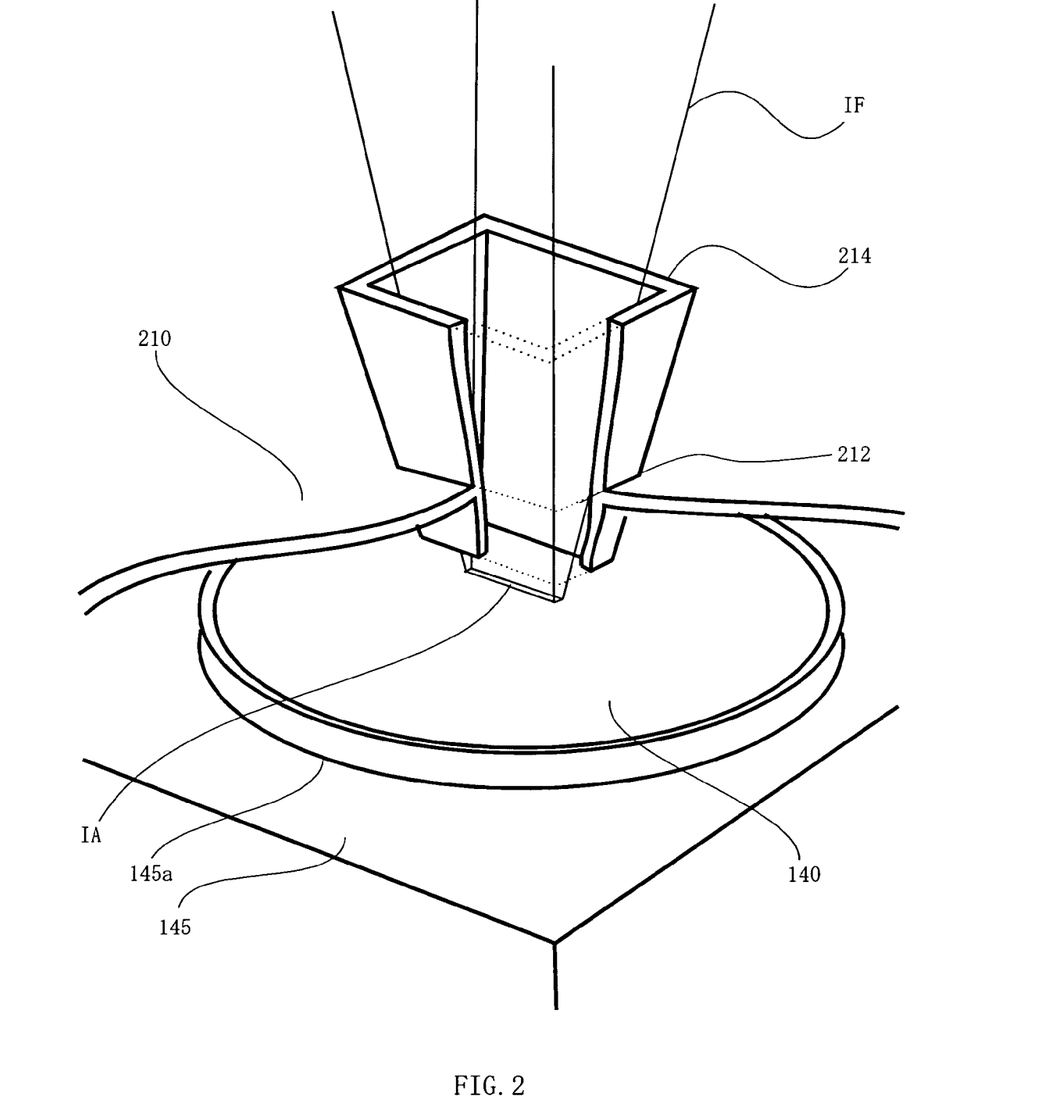
FIG. 2 is a part perspective view of a partition for isolating a wafer stage space and a projection optical system space, and form of an embodiment of an open part that an EUV light passes.

FIG. 2 is a part perspective view of the partition 210 for isolating to the wafer stage space WSS and the projection optical system space POS, and form of an embodiment of the open part 212 which the EUV light passes. In FIG. 2, IA is an irradiation area of exposure light onto wafer, 214 is an orifice wall to allow light to pass through to the open part 212, and IF is EUV light that passes from the projection optical system 130.

The wafer stage space WSS and the projection optical system space POS, shown in FIG. 2, have the partition 210 at a position near the wafer 140, and have the open part 212 only in the optical path that the EUV light for the exposure passes. The wafer stage space WSS and the projection optical system space POS are connected in the open part 212, and can be called one space, but the wafer stage space WSS and the projection optical system space POS are separately expressed as substantially two spaces to manage a degree of vacuum by the management part 250 and 260 separately.

Because it is necessary to reduce the open part 212 that connects the wafer stage space WSS and the projection optical system space POS as much as possible, it is desirable that the open part 212 is located in the close proximity of the object 140 that the EUV light condensing upon. Moreover, the conductance of the open part 212 might not be adjusted to the desire value only by locating the open part 212 in the partition 210, shown in FIG. 2, so that the orifice wall 214 is wide enough for the open part 212 so as not to interrupt the optical path of the EUV light. The orifice wall 214 and the open part 212 is made changeable to adjust the conductance. Therefore, the adjoined space, in the other ward, the wafer stage space WSS and the projection optical system space POS can set the desired differential pressure, and the impurities can be prevented from diffusing to the next space.

The projection optical system space POS and the reticle stage space RSS are similarly isolated by the partition 220 that has the open part 222 only in optical path that the EUV light reflected on the reticle 120 passes. Moreover, the reticle stage space RSS and the illumination optical system space IOS are similarly isolated by the partition 230 that has the open part 232 only in optical path where the EUV light illuminating the reticle 120 passes. The projection optical system space POS and the illumination optical system space IOS are isolated by the part of the partition 220 and 230, and the open part does not exist between the projection optical system space POS and the illumination optical system space IOS.

The illumination optical system space IOS and the light source space LSS are isolated by the partition 240 that has the open part 242 in optical path that the EUV light passes. Moreover, it is desirable that the very thin silicon window, with a thickness of about 100 nm, is located in the open part 242 so that components of the gas should not influence the illumination optical system 114 when the gas plasma light source is used for the EUV light source 112.

The chamber 200 is formed with the set of the wafer stage space WSS, the projection optical system space POS, the reticle stage space RSS, illumination optical system space IOS and light source space LSS, and isolated completely with the atmosphere. Each space is a substantial vacuum chamber connected by small openings of the open part 212 to 214.

The management part 250 to 290, that manages a degree of vacuum of each space, is located in the wafer stage space WSS, the projection optical system space POS, the reticle stage space RSS, the illumination optical system space IOS and the light source space LSS. The management parts 250, 260, 270, 280 and 290 have the exhaust part 252, 262, 272, 282 and 292 that exhaust each space, which is achieved, for example, by turbo molecular pump that can be exhausted to high vacuum.

As described above, the wafer stage space WSS, the projection optical system space POS, the reticle stage space RSS, the illumination optical system space IOS and the light source space LSS can be exhausted even if there is no the exhaust part 252, 262, 272, 282 and 292 in each space because these spaces connect by the open part 212, 222, 232 and 242, but all spaces cannot necessarily be exhausted to the high vacuum by conductance of the open part 212, 222, 232 and 242.

It is necessary to exhaust it to the high vacuum as much as possible to remove the components of impurity of the wafer stage space WSS, the projection optical system space POS, the reticle stage space RSS, the illumination optical system space IOS and the light source space LSS. Thus, an opening and shutting mechanism shuts the opening of the open part 212, 222, 232 and 242 that connects each space, and it is possible to exhaust it by completely isolating each space, when exhausting. Therefore, especially, the space that the optical system is arranged (the projection optical system space POS and the illumination optical system space IOS) becomes possible the exhaust to the ultrahigh vacuum, and the components of moisture and the carbon of the optical system space can be minimized.

The management part 260 and 280 have a supply part 264 and 284 that supply an inert gas to the projection optical system space POS and the illumination optical system space IOS, and a supply controller 266 and 286 that control a supply amount of the inert gas supplied by the supply part 264 and 284. As a result, controlling the pressure of each space more precisely becomes possible, and the pressure fluctuation can be suppressed as much as possible. The supply part and the supply controller, basically, may be located at the management part of the space that sets pressure high. Shown in FIG. 1, when the chamber 200 is divided into plural spaces, the inert gas is supplied to the space that is the nearest to, the light source. In the instant embodiment, helium is supplied to the illumination optical system space IOS, and the degree of vacuum (pressure) of each space is controlled to a predetermined value. The pressure of the illumination optical system space IOS is assumed to be 0.1 Pa, the pressure of the reticle stage space RSS is assumed to be 0.01 Pa, the pressure of the projection optical system space POS is assumed to be 0.001 Pa and the pressure of the wafer stage space WSS is assumed to be 0.0005 Pa by supplying the high purity helium to the illumination optical system space IOS that is near the EUV light source 112.

According to such the structure, the probability of the out gas, generated from the wafer and resist spread on wafer (object 140) carried into the wafer stage space WSS, reaching the projection optical system 130 decreases. Moreover, the probability of the out gas reaching the illumination optical system 114 in the former steps decreases extremely.

Because helium is supplied, the attenuation of the EUV light by the gas of the optical path space from the EUV light source 112 to the object 140 is few, and it is not several % different compared with the case to keep a high vacuum the entire optical path space. The supplied gas acceptable is not helium but the high purity nitrogen gas, but attenuation by the optical path space of the EUV light grows compared with the case to use helium. In this case, the attenuation of the EUV light can be reduced by lowering the pressure of each space. It is necessary to lower the pressure of the wafer stage space WSS more by lowering the pressure of each space, but creating the high vacuum is difficult because the moving mechanism for the scanning exposure and the carrying mechanism that carries the wafer are arranged in the wafer stage space WSS. Moreover, as described above, there is the out gas from the resist, and the pressure (degree of vacuum) of the wafer stage space WSS is about $1 \times 10^{-5}$ Pa. Therefore, when helium is not used, a small pressure difference between each space etc. is needed.

In the instant embodiment, the turbo molecular pumps as the exhaust part 252, 262, 272, 282 and 292 are located in the wafer stage space WSS, the projection optical system space POS, reticle stage space RSS, the illumination optical system space IOS and the light source space LSS, but a valve with large area of opening that can be opened and shut may be located in the partition 210, 220, 230 and 240 of each space. Therefore, it is possible to exhaust the plural spaces by locating one of the turbo molecular pump in one of the plural spaces by completely opening the valve when exhausting.

Likewise, in the instant embodiment, the chamber 200 is substantially isolated to five spaces. However, it is possible to isolate to the space more than five so as not to make the influence of the out gas from the resist easy to reach the space of the foremost steps and to manage each pressure gradually. If an enough differential pressure is obtained between the wafer stage space WSS and the projection optical system space POS, it is also possible to make the projection optical system space POS, the illumination optical system space IOS, and the reticle stage space RSS the same space.

Moreover, in the instant embodiment, the wafer stage space WSS is assumed to be the lowest pressure, and the pressure gradient is such that pressure increases in a direction towards the EUV light source 112. However, as long as the pressure of the wafer stage space WSS is at least lower than the pressure of the projection optical system space POS, the pressure gradient where pressure increases only in the direction of the EUV light source 112 need not necessarily be formed.

A substantial isolated position of any space is not the one limiting to the instant embodiment, it may be the condensing position of the EUV light used for the exposure or the position that any open part obtains desire conductance.

Figure 3:
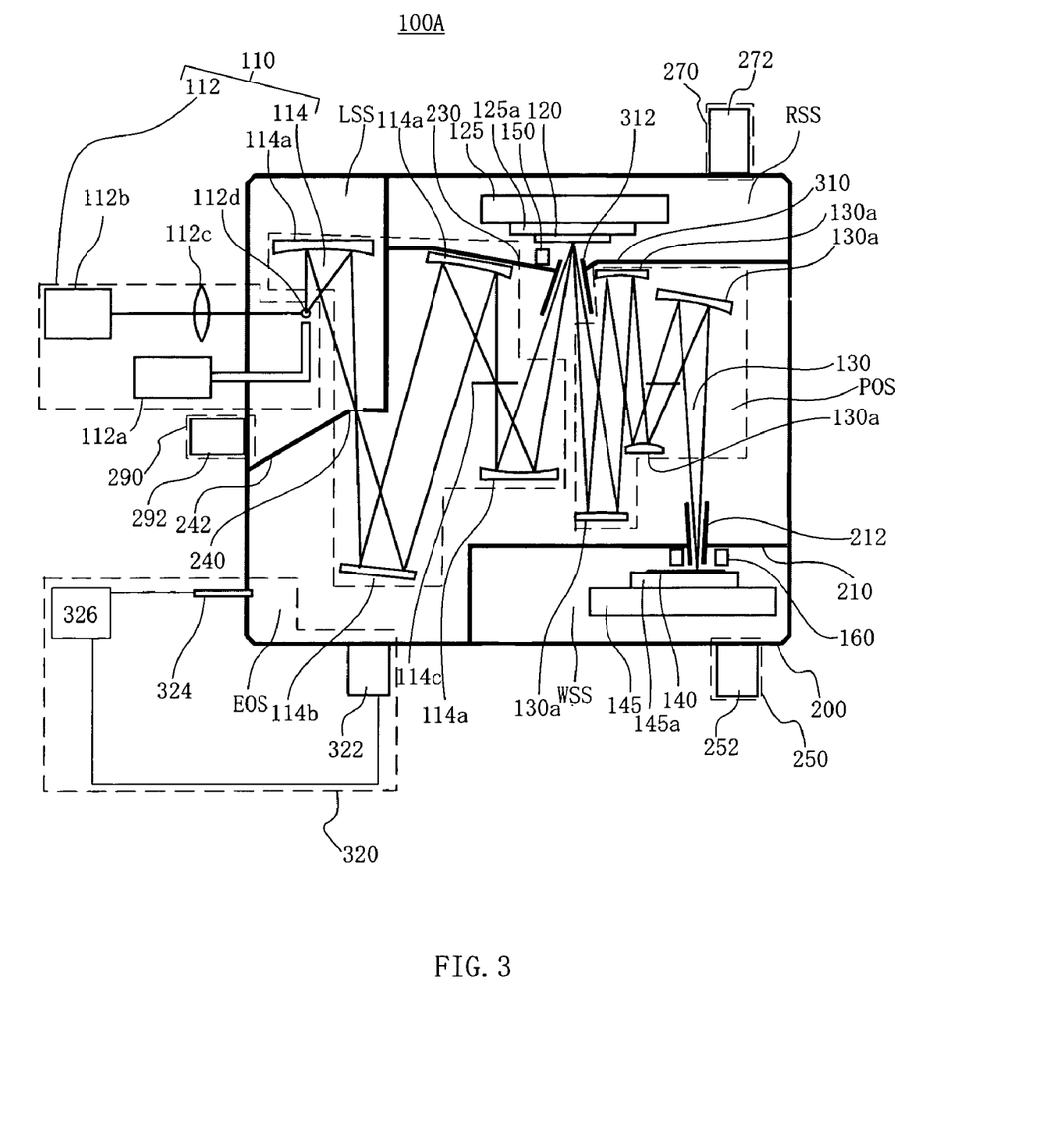
FIG. 3 is a schematic sectional view of a variation of an exposure apparatus shown in FIG. 1.

Next, referring now to FIG. 3, a description will be given of an exposure apparatus 100A that is a variation of the exposure apparatus 100. FIG. 3 is a schematic sectional view of the variation of the exposure apparatus shown in FIG. 1.

The exposure apparatus 100A is the same as the exposure apparatus 100A of FIG. 1, it is different in that the exposure apparatus 100A isolates neither the projection optical system space POS nor the illumination optical system space IOS, and arranges the projection optical system 130 and the illumination optical system 112 as an exposure optical system in the same space (an exposure optical system space EOS). In other word, the exposure apparatus 100A is different the position in the chamber 200 where the space is isolated.

The exposure optical system space EOS and reticle stage RSS are isolated by a partition 310 that has an open part 312 only in optical path that the EUV light illuminates the reticle 120 passes and the optical path that the EUV light reflected on the reticle 120 passes. The management part 320 that manages a degree of vacuum is located in the exposure optical system space EOS. The management part 320 has an exhaust part 322 that exhausts the exposure optical system space EOS, a supply part 324 that supplies the inert gas to the exposure optical system space EOS, and a supply controller 326 that controls a supply amount of the inert gas supplied by the supply part 324, as well as the exposure apparatus 100.

In the instant embodiment, the degree of vacuum of the reticle stage space RSS is set higher than the exposure optical system space EOS. The driving mechanism as the moving mechanism for the scanning exposure and the changing mechanism for changing the reticle is arranged in the reticle stage space RSS, and the out gas is generated from the these parts. Therefore, making of the reticle stage space RSS to the high vacuum is difficult as well as the wafer stage space WSS. On the other hand, the illumination optical system 114 and the projection optical system 130 hardly have the driving mechanism, so that there is relatively small amount of out gas.

When the reticle stage 145 and the illumination optical system 114 or the projection optical system 130 exist in the same space like the prior art, the out gas from the driving mechanism of the reticle stage 145 reaches the illumination optical system 114 and the projection optical system 130, and there is an influence possibility such as adhering of the out gas to the mirror.

Then, in the instant embodiment, isolating three spaces of the projection optical system space EOS, reticle stage space RSS and the wafer stage space WSS by the partition 210, 240 and 310 excluding the EUV light source 112, and making three spaces substantially by removing partition 220. Moreover, it maintains supplying the helium gas in a predetermined amount in the exposure optical system space EOS via the supply part 324 and the supply controller 326. The reticle stage space RSS and the wafer stage space WSS are exhausted by the turbo molecular pump as the exhaust part 262 and 272.

The open part 212 and 312 for the EUV light to pass, as described above, has the thickness by the orifice wall etc. to form a necessary differential pressure for each space. Especially, the open part 312 that connected the reticle stage space RSS to the exposure optical system space EOS should be wide enough to accommodate the increase in width of the optical path that the EUV light that illuminates the reticle 120 passes and the optical path that the EUV light reflected from the reticle 120 passes.

In the instant embodiment, the pressure of the exposure optical system space EOS is assumed to be 0.1 Pa, the pressure of the wafer stage space WSS is assumed to be 0.02 Pa. According to such the structure, the moisture and the carbon generated by the wafer stage space WSS and the reticle stage space RSS can be prevented from diffusing to the exposure optical system space EOS.

In exposure, the EUV light emitted from the EUV light source 112 illuminates the reticle 120 via the illumination optical system 114. The EUV light that reflects the pattern of the reticle 120 repeats the reflection by the projection optical system 130 and is imaged onto the object 140. The instant embodiment uses an arc or ring shaped image plane, scans the reticle 120 and object 140 at a speed ratio corresponding to a reduction ratio to expose the entire surface of the reticle 120. In this case, the space that the wafer stage, the projection optical system and the illumination optical system are arranged is substantially isolated by the partition only in the part that the EUV light for the exposure passes, and the space that the wafer stage is arranged is at least exhausted, and the degree of vacuum of the space is managed by the management part. Therefore, the out gas generated from the space that the wafer stage is arranged so that the out gas does not easily influence the space that the projection optical system and the illumination optical system are arranged, and the steady exposure can always be achieved.

Moreover, the pressure of the space that the wafer stage and the reticle stage have the driving mechanism is arranged is managed lower than the pressure of the space that the projection optical system and the illumination optical system are arranged. Therefore, the out gas generated from the driving mechanism etc. is prevented from diffusing to the space that the projection optical system and the illumination optical system are arranged, and the adhesion of impurities to the mirror can be decreased.

Figure 4:
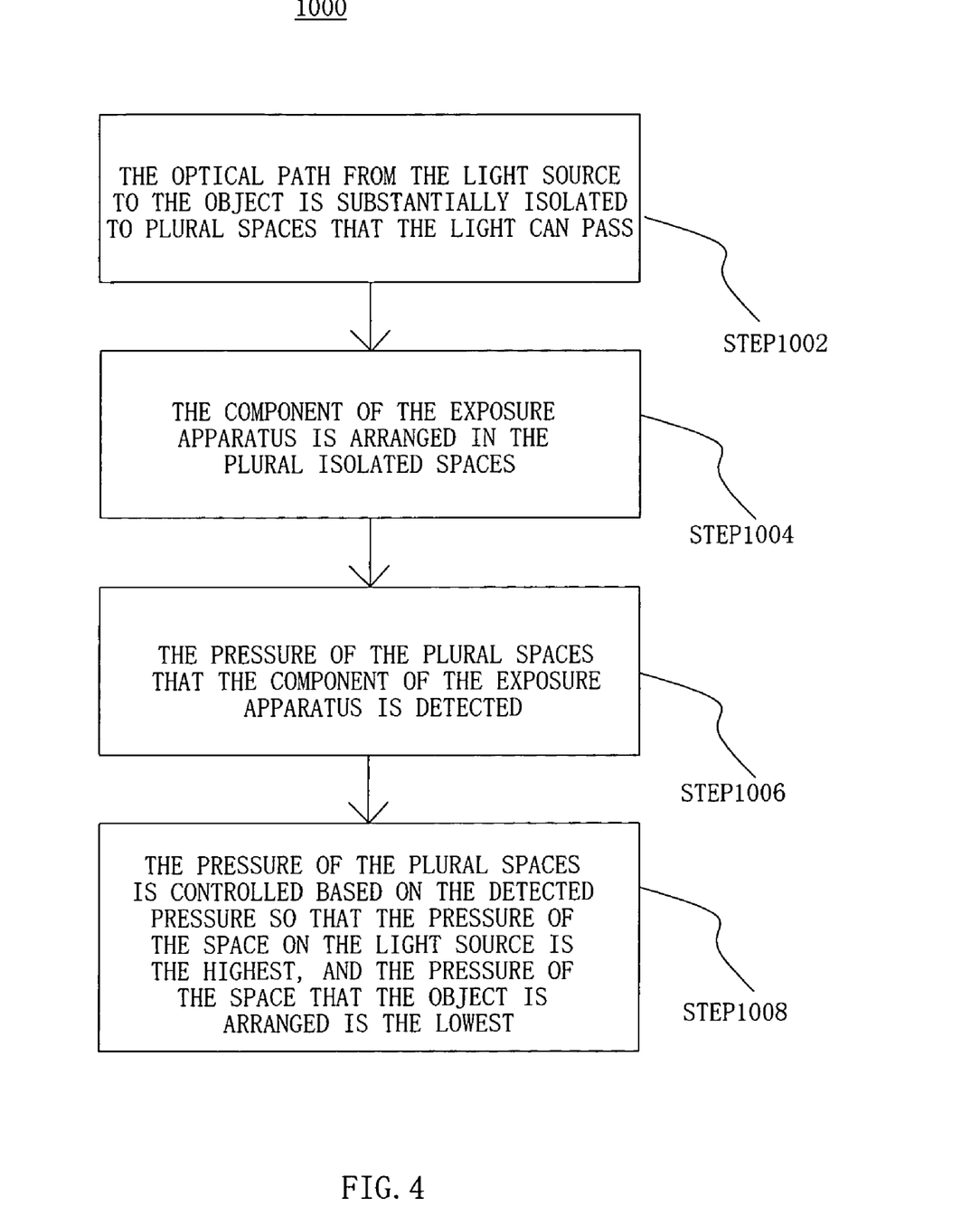
FIG. 4 is a flowchart for explaining an exposure method as one aspect according to the present invention.

The present invention has the side as an exposure method 1000 explained referring to FIG. 4. FIG. 4 is a flowchart for explaining the exposure method 1000 as one aspect according to the present invention.

First, the optical path of the EUV light from the EUV light source 112 to the object 140 is substantially isolated to plural spaces that the EUV light can pass (step 1002). The component of the exposure apparatus 100 is arranged in plural isolated spaces (step 1004). For example, the exposure apparatus 100 is assumed to be the wafer stage space WSS, the projection optical system space POS, the reticle stage space RSS, the illumination optical system space IOS and the light source space LSS by arranging the wafer stage 145, the projection optical system 130, the reticle stage 125, the illumination optical system 114 and the EUV light source 112 in the isolated spaces.

Next, the pressure of the plural spaces that the component of the exposure apparatus 100 is detected (step 1006). The pressure of plural spaces is controlled based on the detected pressure so that the pressure of the space on the EUV light source 112 is the highest, and the pressure of the space that the object 140 is arranged is the lowest (step 1008). This control is done by exhausting the air of the plural isolated spaces, and supplying the predetermined gas such as inert gas.

Therefore, because it can be prevented that the gas generated from the wafer stage and the object diffuses to the space near the optical system and the light source, the influence of the out gas can be suppressed to the minimum, and the steady exposure can be done always.

Figure 5:
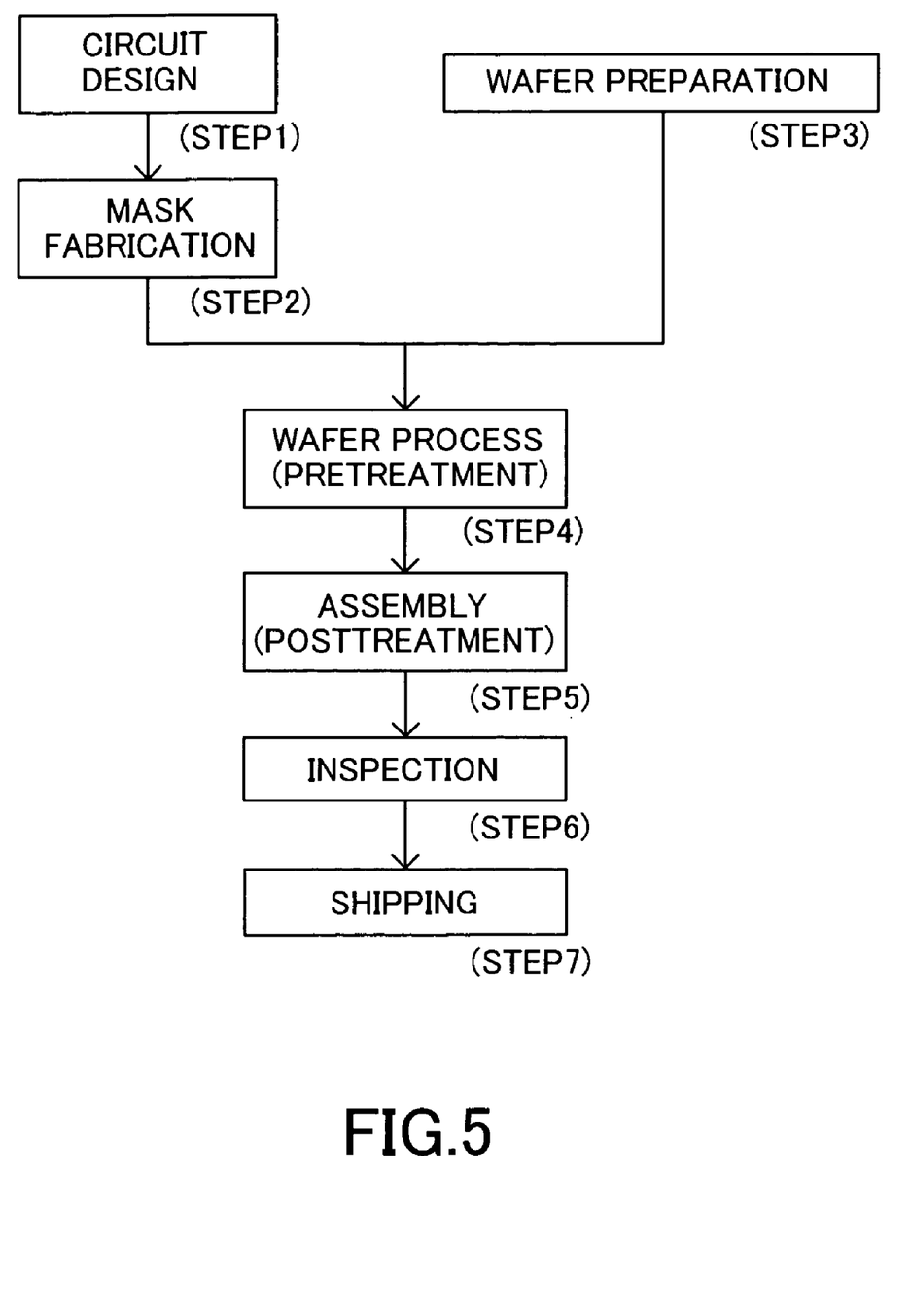
FIG. 5 is a flowchart for explaining how to fabricate devices (such as semiconductor chips such as ICs, LCDs, CCDs, and the like).
Figure 6:
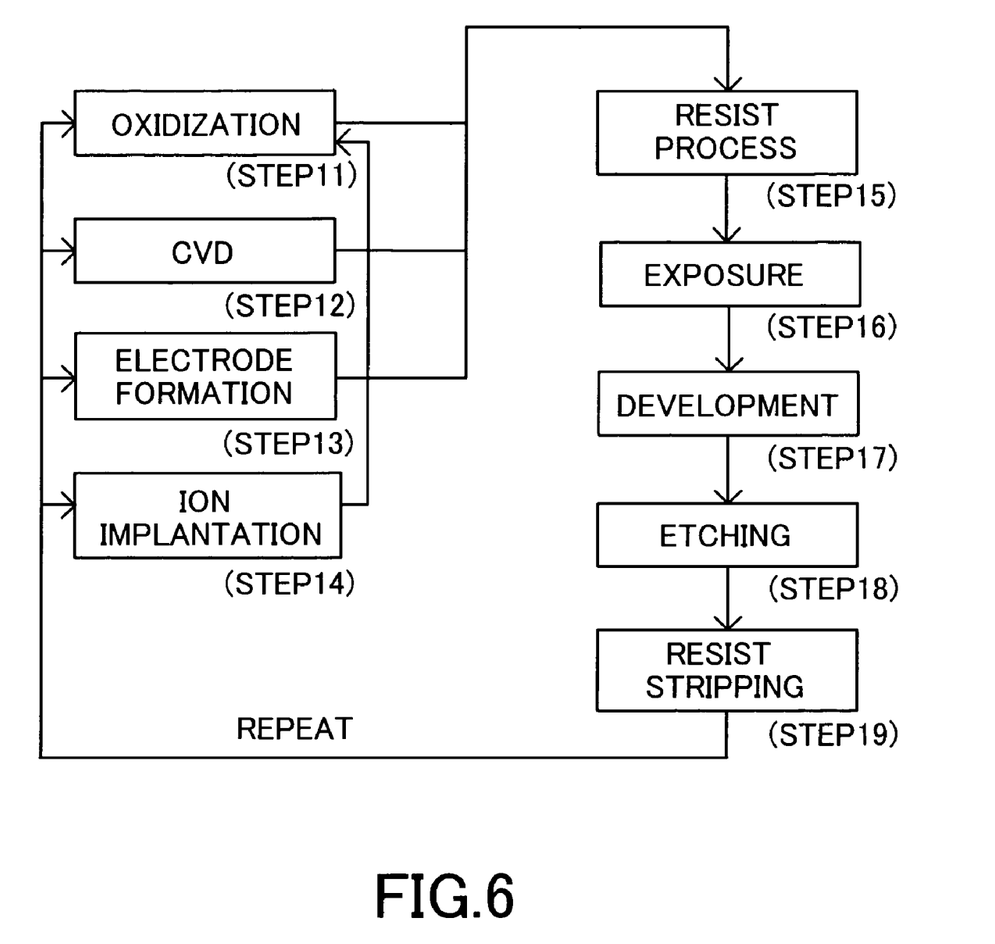
FIG. 6 is a detailed flowchart of a wafer process in Step 4 of FIG. 5.

Referring now to FIGS. 5 and 6, a description will be given of an embodiment of a device fabrication method using the above mentioned exposure apparatus 100 or 100A. FIG. 5 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 6 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 or 100A to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. Use of the fabrication method in this embodiment helps fabricate higher-quality devices than conventional methods. Thus, the device fabrication method using the exposure apparatus 100 or 100A, and resultant devices constitute one aspect of the present invention.

Furthermore, the present invention is not limited to these preferred embodiments and various variations and modifications may be made without departing from the scope of the present invention. For example, the present invention can also be applied to an exposure apparatus that has a light source such as ArF excimer laser, $F_2$ laser and electron beam.

Thus, the present invention provides an exposure apparatus that can stably perform exposure by preventing diffusion of out gas in a space that a mirror and a reticle are arranged, and maintaining high vacuum.

What is claimed is:

1. An exposure apparatus for exposing an object put on a first stage by irradiating light from a light source onto the object through an exposure optical system comprising at least one optical element:

wherein a first space in which the first stage is arranged and a second space in which at least one of the optical elements which comprise the exposure optical system is arranged, each respectively consist of a closed space maintained by a reduced pressure, wherein said first and second spaces are isolated by a partition except for an opening part through which an exposure light passes and are adjacent, wherein said exposure apparatus comprises:

a first management part that manages a pressure of the reduced pressure of the first space; and a second management part that manages a pressure of the reduced pressure of the second space, wherein said pressure of the first space is managed so that the pressure of the first space is equal to or less than the pressure of the second space.

2. An exposure apparatus according to claim 1, wherein said pressure of the second space is 100 Pa or less.

3. An exposure apparatus for exposing an object put on a first stage by irradiating light from a light source onto the object through an exposure optical system comprising at least one optical element, wherein said exposure optical system includes a reticle, an illumination optical system for illuminating the reticle and a projection optical system for transferring a transfer information from the reticle onto the object, wherein a first space in which the first stage is arranged, a third space in which at least one of the optical elements which constitute the projection optical system is arranged, a fourth space in which the reticle is arranged, a fifth space in which at least one of the optical elements which constitute the illumination optical system is arranged and a sixth space in which the light source is arranged, each respectively consist of a closed space maintained by a reduced pressure, wherein said first and second spaces are isolated by a partition except for an opening part through which a projection light passes and are adjacent, the third and fourth spaces are isolated by a partition except for an opening part through which the projection light passes and are adjacent, the fourth and fifth, spaces are isolated by a partition except for an opening part through which an illumination light passes and are adjacent, and the fifth and sixth spaces are isolated by a partition except for an opening part through which a light passes and are adjacent, wherein said exposure apparatus comprises:

a first management part that manages a pressure of the reduced pressure of the first space; and a second management part that manages a pressure of the reduced pressure of the second space;

a third management part that manages a pressure of the reduced pressure of the third space;

a fourth management part that manages a pressure of the reduced pressure of the fourth space;

a fifth management part that manages a pressure of the reduced pressure of the fifth space; and a sixth management part that manages a pressure of the reduced pressure of the sixth space, wherein said pressure of the first space is managed so that the pressure of the first space is the lowest.

4. An exposure apparatus according to claim 3, wherein said pressure of the third space is 100 Pa or less.

5. An exposure apparatus according to claim 3, wherein said pressure of the first space is 10 Pa or less.

6. An exposure apparatus according to claim 3, wherein said pressure of the fourth space is managed so that the pressure of the fourth space is equal to or less than the pressure of the fifth space.

7. An exposure apparatus according to claim 3, wherein said pressure of the fourth space is managed so that the pressure of the fourth space is equal to or less than the pressure of the third space.

8. An exposure apparatus according to claim 3, wherein said first and third through sixth management part include respectively an exhaust part that exhausts respectively the first and third through sixth space.

9. An exposure apparatus according to claim 3, wherein said first and third through sixth management parts include:
 a supply part that supplies a predetermined gas to one of the first and third through sixth spaces or all of the first and third through sixth spaces; and
 a supply controller that controls a supply amount of the predetermined gas supplied by the supply part.

10. An exposure apparatus according to claim 9, wherein the predetermined gas is an inert gas.

11. An exposure apparatus according to claim 10, wherein the inert gas is helium.

12. An exposure apparatus according to claim 3, wherein the light is EUV light.

13. An exposure apparatus according to claim 3, wherein the light is electron beam.

14. An exposure method for illuminating a reticle with light from a light source, and exposing an object to a pattern of the reticle, the exposure method comprising the steps of:
 isolating a light path of the light from the light source to the object to plural spaces light can pass; and
 controlling a pressure of the plural spaces isolated so that a pressure of the space of the light source side is the highest and a pressure of the space that the object is arranged the lowest.

15. An exposure method according to claim 14, wherein the controlling step includes the steps of detecting the pressure of the plural spaces isolated, and
 exhausting the plural spaces based on the pressure of the plural spaces detected.

16. An exposure method according to claim 14, wherein the controlling step includes the steps of detecting the pressure of the plural spaces isolated, and
 supplying a certain gas to the plural spaces based on the pressure of the plural spaces detected.

17. An exposure method according to claim 14, wherein the isolating step isolates the light path of the light from the light source to the object to three spaces or more.

18. A device fabrication method comprising the steps of:
 exposing an object using an exposure apparatus according to claim 1; and
 performing a development process for the object exposed.

* * * * *